United States Patent
Oyama et al.

(10) Patent No.: US 12,165,848 B2
(45) Date of Patent: Dec. 10, 2024

(54) SUBSTRATE PROCESSING METHOD, SUBSTRATE PROCESSING APPARATUS, AND METHOD FOR PRODUCING NANOWIRE OR NANOSHEET TRANSISTOR

(71) Applicant: Tokyo Electron Limited, Tokyo (JP)

(72) Inventors: Kenichi Oyama, Narisaki (JP); Shohei Yamauchi, Narisaki (JP); Kazuya Dobashi, Hillsboro, OR (US); Akitaka Shimizu, Narisaki (JP)

(73) Assignee: Tokyo Electron Limited, Tokyo (JP)

( * ) Notice: Subject to any disclaimer, the term of this patent is extended or adjusted under 35 U.S.C. 154(b) by 250 days.

(21) Appl. No.: 17/755,406

(22) PCT Filed: Oct. 15, 2020

(86) PCT No.: PCT/JP2020/038903
§ 371 (c)(1),
(2) Date: Apr. 28, 2022

(87) PCT Pub. No.: WO2021/085158
PCT Pub. Date: May 6, 2021

(65) Prior Publication Data
US 2022/0406572 A1    Dec. 22, 2022

(30) Foreign Application Priority Data
Oct. 29, 2019   (JP) ................................ 2019-196464

(51) Int. Cl.
*H01J 37/32*    (2006.01)
*H01L 21/02*    (2006.01)
(Continued)

(52) U.S. Cl.
CPC .. *H01J 37/32449* (2013.01); *H01J 37/32357* (2013.01); *H01L 21/02252* (2013.01);
(Continued)

(58) Field of Classification Search
CPC ........... H01J 37/32449; H01J 37/32357; H01J 2237/334; H01J 2237/3387;
(Continued)

(56) References Cited

U.S. PATENT DOCUMENTS

2015/0364483 A1*  12/2015  Koval ............... H01L 21/32137
                                                  438/257
2017/0077232 A1*  3/2017  Balakrishnan ...... H01L 29/7853
(Continued)

FOREIGN PATENT DOCUMENTS

JP   2018006405 A    1/2018
JP   2018-170380 A   11/2018
(Continued)

*Primary Examiner* — Duy Vu N Deo
(74) *Attorney, Agent, or Firm* — Armstrong Teasdale LLP

(57) ABSTRACT

The present disclosure appropriately shortens a processing step for processing a substrate in which a silicon layer and a silicon germanium layer are alternatively laminated. The present disclosure provides a substrate processing method of processing the substrate in which the silicon layer and the silicon germanium layer are alternatively laminated, which includes forming an oxide film by selectively modifying a surface layer of an exposed surface of the silicon germanium layer by using a processing gas including fluorine and oxygen and converted into plasma.

20 Claims, 7 Drawing Sheets

(51) Int. Cl.
*H01L 21/3065* (2006.01)
*C23C 8/24* (2006.01)

(52) U.S. Cl.
CPC ...... *H01L 21/0234* (2013.01); *H01L 21/3065* (2013.01); *C23C 8/24* (2013.01); *H01J 2237/334* (2013.01); *H01J 2237/3387* (2013.01)

(58) Field of Classification Search
CPC ........... H01L 21/02252; H01L 21/0234; H01L 21/3065; H01L 29/0673; H01L 29/42392; H01L 29/775; H01L 21/02236; H01L 21/02321; H01L 21/02332; H01L 29/66439; H01L 29/6656; H01L 21/67069; H01L 29/0665; H01L 29/66795; H01L 29/785; H01L 29/66545; H01L 29/66742; C23C 8/24; C23C 8/02; C23C 8/10; C23C 8/12; C23C 8/20; C23C 8/36; C23C 8/80; C23C 28/30; C23C 28/32; C23C 28/322; C23C 28/34; C23C 28/341; C23C 28/345; C23C 28/40; C23C 28/42; B82Y 10/00; B82Y 40/00

USPC ....................................................... 438/718
See application file for complete search history.

(56) References Cited

U.S. PATENT DOCUMENTS

| | | |
|---|---|---|
| 2019/0172755 A1 | 6/2019 | Smith et al. |
| 2019/0228981 A1* | 7/2019 | Asada ..................... H01L 21/28 |
| 2019/0318937 A1* | 10/2019 | Yang ................... H01L 21/0234 |

FOREIGN PATENT DOCUMENTS

| | | |
|---|---|---|
| KR | 20060064569 A | 6/2006 |
| KR | 20150009961 A | 1/2015 |
| KR | 20150041567 A | 4/2015 |
| TW | 200935513 A | 8/2009 |
| TW | 201735256 A | 10/2017 |
| TW | 201738955 A | 11/2017 |
| TW | 201806028 A | 2/2018 |
| WO | 2009085958 A2 | 7/2009 |
| WO | 2017120102 A1 | 7/2017 |
| WO | 2017151958 A1 | 9/2017 |

* cited by examiner

SUBSTRATE PROCESSING METHOD, SUBSTRATE PROCESSING APPARATUS, AND METHOD FOR PRODUCING NANOWIRE OR NANOSHEET TRANSISTOR

CROSS-REFERENCE TO RELATED APPLICATIONS

The present application is a U.S. National Stage Entry of International Patent Application No. PCT/JP2020/038903, filed Oct. 15, 2020, which claims the benefit of priority to Japanese Patent Application No. 2019-196464, filed Oct. 29, 2019, each of which is hereby incorporated herein by reference in its entirety.

TECHNICAL FIELD

The present disclosure relates to a substrate processing method, a substrate processing apparatus, and a method for manufacturing a nanowire or nanosheet transistor.

BACKGROUND

Patent Document 1 discloses a method of selectively etching a silicon germanium layer on a substrate in which the silicon germanium layer and, for example, a silicon layer are exposed. According to the etching method described in Patent Document 1, by simultaneously supplying a fluorine-containing gas and a chlorine trifluoride gas to the substrate in a vacuum atmosphere, an etching rate is made uniform and an etching amount of the silicon germanium layer is made uniform.

PRIOR ART DOCUMENTS

Patent Documents

Patent Document 1: Japanese Laid-Open Patent Publication No. 2018-170380

The technique according to the present disclosure appropriately shortens a processing step in the processing of a substrate in which a silicon layer and a silicon germanium layer are alternately laminated.

SUMMARY

An aspect of the present disclosure relates to a substrate processing method of processing a substrate in which a silicon layer and a silicon germanium layer are alternately laminated, including forming an oxide film by selectively modifying a surface layer of an exposed surface of the silicon germanium layer by using a processing gas including fluorine and oxygen and converted into plasma.

According to the present disclosure, a processing step in the processing of a substrate in which a silicon layer and a silicon germanium layer are alternately laminated is appropriately shortened.

DETAILED DESCRIPTION

Figure 1A:
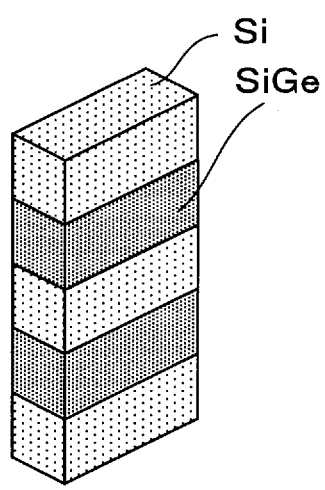
FIGS. 1A to 1D are explanatory views schematically illustrating wafer processing states in the related art.
Figure 1B:
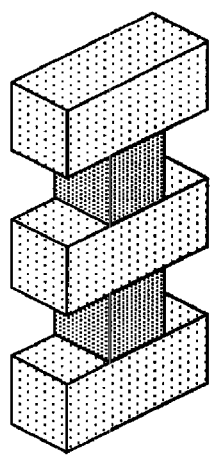
Figure 1C:
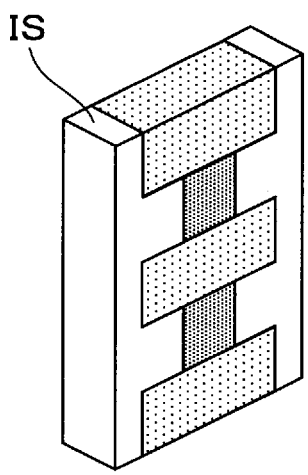
Figure 1D:
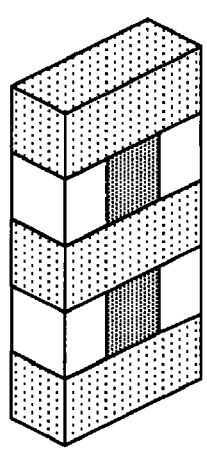

In semiconductor devices, silicon-containing films are widely applied to various applications. For example, a silicon germanium (SiGe) film or a silicon (Si) film is used for a gate electrode, a seed layer, or the like. In the related art, in a process of manufacturing a gate-all-around (GAA) transistor, such as a nanosheet or a nanowire, as illustrated in FIGS. 1A to 1D, (a) stacking of SiGe films and Si films on a substrate (a wafer W), (b) selective etching of the SiGe films, (c) embedding of an inner spacer (IS) as an interlayer insulating film, and (d) etching of an excess inner spacer are performed in sequence. The interlayer insulating film embedded in (c) is configured as an insulating film between a metal gate and a channel to be embedded in the subsequent steps.

The technique disclosed in Patent Document 1 described above is a method for performing (b) the selective etching of the SiGe film. In the selective etching of the SiGe films, it is required to control an etching amount of each laminated SiGe film to be uniform. According to the etching method disclosed in Patent Document 1, by simultaneously supplying the fluorine-containing gas and the chlorine trifluoride gas, the etching amounts of the SiGe films are made uniform.

However, in such a manufacturing process in the related art, since high-precision machining is required in each of the steps (a) to (d), there are problems of low yield and excessive cost, which need be improved.

Therefore, as a result of research by the present inventors, it was found that etching and oxidation of SiGe films proceed at the same time in radical oxidation process on a wafer W. That is, as a result, it has been newly found that the steps (a) to (d) of the manufacturing process in the related art may be omitted. Such findings are not described in Patent Document 1.

The technique according to the present disclosure is based on such findings, and appropriately shortens the processing steps in the processing of a substrate in which a silicon (Si) layer and a silicon germanium (SiGe) layer are alternately laminated. Hereinafter, a plasma processing apparatus as a substrate processing apparatus according to the present embodiment and a plasma processing method as a substrate processing method performed by using the plasma processing apparatus will be described with reference to the drawings. In the specification and drawings, elements having substantially the same functional configurations will be denoted by the same reference numerals, and redundant explanations will be omitted.

<Plasma Processing Apparatus>

Figure 2:
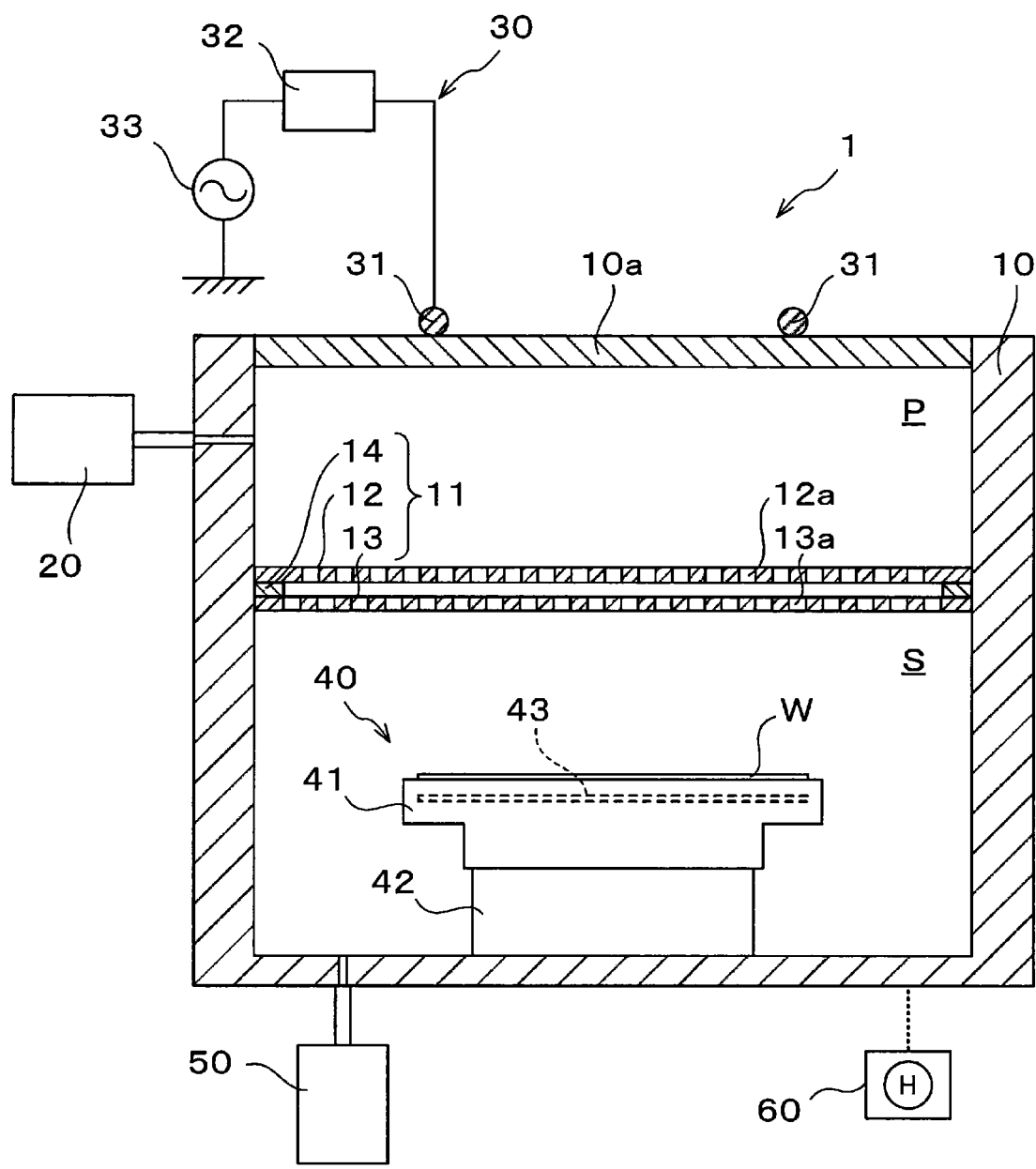
FIG. 2 is a vertical cross-sectional view illustrating an example of a configuration of a plasma processing apparatus.

FIG. 2 is a vertical cross-sectional view schematically illustrating an outline of the configuration of a plasma processing apparatus 1. In the following description, end surfaces on which alternately arranged SiGe layers and the Si layers are respectively exposed may be referred to as "exposed surfaces" of the SiGe layers and the Si layers.

In the plasma processing apparatus 1, among the Si layers and the SiGe layers formed to be laminated on the wafer W, the SiGe layers are selectively modified. Specifically, deposits on the exposed surfaces of the SiGe layers are selectively removed, and the SiGe layers are oxidized, whereby an oxide film ($SiO_2$ film) is formed in surface layers of the exposed surfaces of the SiGe layers on the wafer W, that is, in a depth direction from the exposed surfaces.

As illustrated in FIG. 2, the plasma processing apparatus 1 includes a processing container 10 having a closed structure that accommodates a wafer W. The processing container 10 includes, for example, aluminum or an aluminum alloy, and has an opened upper end, and an upper end of the processing container 10 is closed by a lid 10a serving as a ceiling. A wafer W carry-in/out port (not illustrated) of a wafer W is provided at a side surface of the processing container 10 and the processing container 10 is connected to an exterior of the plasma processing apparatus 1 via this carry-in/out port. The carry-in/out port is configured to be openable/closable by a gate valve (not illustrated).

The interior of the processing container 10 is partitioned by a partition plate 11 into an upper plasma generation space P and a lower processing space S. That is, the plasma-processing apparatus 1 according to the present embodiment is configured as a remote plasma processing apparatus in which the plasma generation space P is separated from the processing space S.

The partition plate 11 includes at least two plate-shaped members 12 and 13 arranged to overlap each other from the plasma generation space P toward the processing space S. A spacer 14 configured to adjust a distance between the plate-shaped members 12 and 13 is arranged between the plate-shaped members 12 and 13. The plate-shaped members 12 and 13 have slits 12a and 13a formed therethrough in the overlapping direction respectively. The respective slits 12a and 13a are arranged not to overlap each other in a plan view, which causes the partition plate 11 to function as a so-called ion trap that suppresses permeation of ions in the plasma into the processing space S when the plasma is generated in the plasma generation space P. More specifically, a slit arrangement structure in which the slits 12a and the slits 13a are arranged not to overlap each other, namely, a labyrinth structure, prevents movement of anisotropically-moving ions while allowing isotropically-moving radicals to permeate therethrough.

The structure of the partition plate 11 is not limited to the illustrated examples, and may have any configuration.

The plasma generation space P includes a gas supply part 20 configured to supply a processing gas into the processing container 10 and a plasma generation part 30 configured to convert the processing gas supplied into the processing container 10 into plasma.

A plurality of gas sources (not illustrated) are connected to the gas supply part 20, and these gas sources supply processing gases including a fluorine-containing gas (e.g., $NF_3$ gas), an oxygen-containing gas (e.g., $O_2$ gas), and a dilution gas (e.g., Ar gas) into the processing container 10.

In addition, types of the fluorine-containing gas, the oxygen-containing gas, and the dilution gas are not limited thereto, and may be arbitrarily selected.

The gas supply part 20 is provided with a flow rate regulator (not illustrated) configured to regulate an amount of the processing gas supplied to the plasma generation space P. The flow rate regulator includes, for example, an opening/closing valve and a mass flow controller.

The plasma generation part 30 is configured as an inductively-coupled apparatus using an RF antenna. The lid 10a of the processing container 10 is formed of, for example, a quartz plate and is configured as a dielectric window. An RF antenna 31 configured to generate inductively-coupled plasma in the plasma generation space P of the processing container 10 is formed above the lid 10a, and the RF antenna 31 is connected to an RF power supply 33 via a matcher 32.

The matcher 32 includes a reactance-variable matching circuit (not illustrated) for matching an impedance on the side of the RF power supply 33 with an impedance on the side of a load (RF antenna 31 or plasma).

The RF power supply 33 outputs RF power of a predetermined frequency (usually, 13.56 MHz or higher) suitable for plasma generation through inductively-coupled RF discharge at an arbitrary output value.

The processing space S includes a stage 40 on which a wafer W is placed in the processing container 10 and an exhaust part 50 configured to discharge the processing gas in the processing container 10.

The stage 40 includes an upper stage 41 on which the wafer W is placed and a lower stage 42 fixed to a bottom surface of the processing container 10 to support the upper stage 41. Inside the upper stage 41, a temperature adjustment mechanism 43 which adjusts a temperature of the wafer W is provided.

Outside the stage 40, the exhaust part 50 is connected to an exhaust mechanism (not illustrated), such as a vacuum pump, via an exhaust pipe provided in the bottom portion of the processing container 10. The exhaust pipe is provided with an automatic pressure control valve (APC). A pressure within the processing container 10 is controlled by the exhaust mechanisms and the automatic pressure control valve.

The plasma processing apparatus 1 described above is provided with a controller 60 as a controller. The controller 60 is, for example, a computer including a CPU, a memory, or the like, and includes a program storage part (not illustrated). The program storage part stores a program that controls a processing of the wafer W in the plasma processing apparatus 1. The program storage part also stores a program that controls an operation of a drive system of the above-mentioned various processing apparatus, a transport apparatus, or the like so as to implement wafer processing to be described later in the plasma processing apparatus 1. The program may be recorded in a computer-readable storage medium H, and may be installed in the controller 60 from the storage medium H.

<Plasma Processing>

The plasma processing apparatus 1 according to the present embodiment is configured as described above. Next, plasma processing performed by using the plasma processing apparatus 1 will be described. In a wafer W to be carried into the plasma processing apparatus 1, the above-mentioned Si layers and SiGe layers are formed to be alternately laminated in advance.

First, the wafer W in which Si layers and SiGe layers are formed to be alternately laminated as described above is carried into the plasma processing apparatus 1 and placed on the stage 40 by a wafer transport mechanism (not illustrated) provided outside the plasma processing apparatus 1.

In the carried-in wafer W, among the Si layers and the SiGe layers formed to be laminated on the wafer W, the SiGe layers are selectively modified. Specifically, processing gases (a $NF_3$ gas, an $O_2$ gas, and an Ar gas in the present embodiment) are supplied from the gas supply part 20 to the plasma generation space P, and RF power is supplied to the RF antenna 31 to generate a plasma containing oxygen and fluorine as an inductively-coupled plasma. In other words, the generated plasma contains fluorine radicals (F*) and oxygen radicals (O*).

Here, flow rates of the processing gases supplied to the plasma generation space P are preferably $O_2:NF_3$=100 to 2,500 sccm:1 to 20 sccm, and more preferably a volume ratio of the $NF_3$ gas to the $O_2$ gas is 0.1 vol % or more and 1.0 vol % or less. In addition, an output of the RF power in the plasma generation space P is preferably 100 W to 1,000 W, and a pressure (vacuum degree) of the plasma generation space P is preferably 6.67 Pa to 266.6 Pa (50 mTorr to 2,000 mTorr). In addition, the temperature of the plasma generation space P is preferably 0 degrees C. to 120 degrees C., and more preferably 15 degrees C. to 100 degrees C.

Figure 3A:
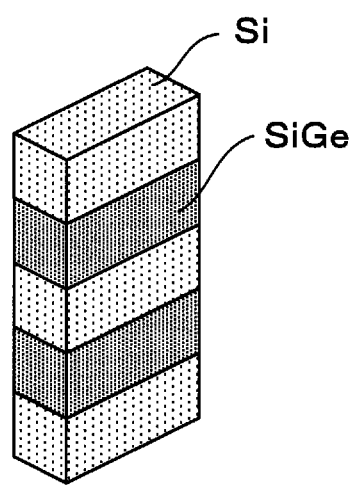
FIGS. 3A and 3B are views schematically illustrating examples of wafer processing states according to an embodiment of the present disclosure.
Figure 3B:
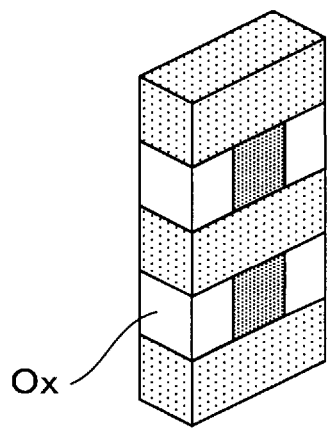

The plasma generated in the plasma generation space P is supplied to the processing space S via the partition plate 11. Here, since the partition plate 11 has the labyrinth structure formed as described above, only the radicals generated in the plasma generation space P permeate into the processing space S. Then, the radicals supplied to the processing space S are allowed to act on the exposed surfaces of the SiGe layers as illustrated in FIG. 3A, whereby the SiGe layers are modified as illustrated in FIG. 3B and an oxide film Ox is formed on each of the surface layers of the exposed surfaces of the SiGe layers.

Figure 4:
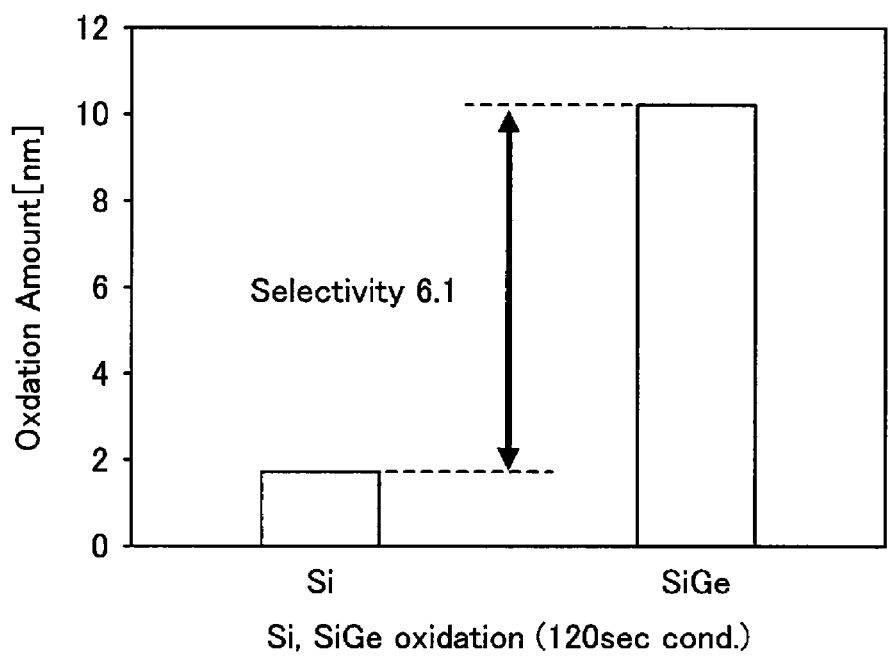
FIG. 4 is a graph showing a comparison of oxidation amounts of a silicon layer and a silicon germanium layer in a plasma processing according to an embodiment of the present disclosure.
Figure 5:
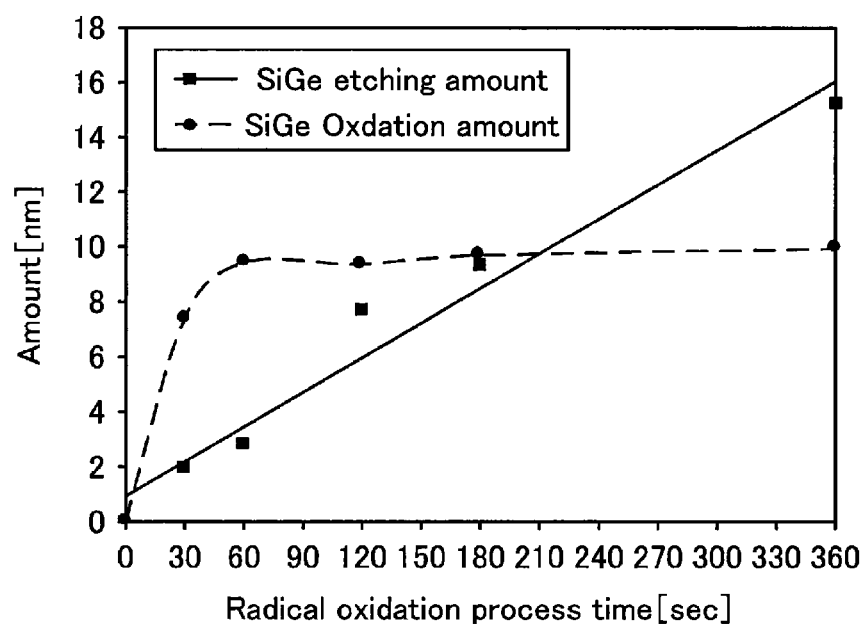
FIG. 5 is a graph showing an example of changes in an oxidation amount and an etching amount of a silicon germanium layer over time in a plasma processing according to an embodiment of the present disclosure.
Figure 5:
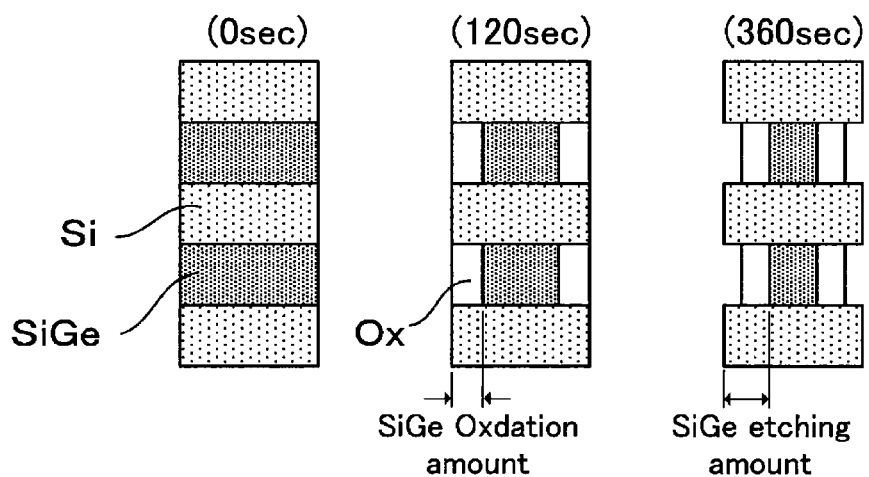

FIG. 4 is a graph showing a comparison of oxidation amounts of Si layers and SiGe layers in the plasma processing according to the present embodiment. FIG. 5 is a graph showing an example of changes in the oxidation amount and the etching amount of SiGe layers over time in the plasma processing according to the embodiment. The "etching amount" of SiGe layers means a distance from an outer end portion of a wafer W (Si layer) to the outer end portions of the SiGe layers as illustrated in FIG. 5. In addition, the "oxidation amount" of SiGe layers means a radial thickness of the oxide film Ox formed on the exposed surfaces of the SiGe layers as illustrated in FIG. 5.

As illustrated in FIG. 4, it was found that in the plasma processing according to the present embodiment, the oxidation amount (oxidation rate) of the SiGe layers was about 6 times the oxidation amount (oxidation rate) of the Si layers. In other words, it was found that the SiGe layers may be appropriately selectively modified (oxidized) by the plasma processing according to the present embodiment.

In addition, as shown in FIG. 5, by laminating Si and SiGe and performing plasma processing, it was possible to control the etching amount of the SiGe layers, that is, the radial dimension of the SiGe layers remaining on the wafer W to be linear with respect to the processing time. Meanwhile, it was found that by laminating Si and SiGe and performing plasma processing, the oxidation amount of the SiGe layer, that is, the radial thickness of the oxide film ($SiO_2$ film) formed on the exposed surface of the SiGe layer is saturated at about 10 nm irrespective of the processing time. In other words, according to the plasma processing according to the present embodiment, since it is possible to appropriately control the etching amount of the SiGe layers while maintaining the oxidation amount of the SiGe layers at a desired value, it is possible to control a line width of the SiGe layer, that is, a width of a channel to be formed in a post-process, to an arbitrary dimension.

The modification of the SiGe layers will be specifically described. When radicals permeate into the processing space S, first, deposits attached to the exposed surfaces of the SiGe layers (for example, attached by a reactive ion etching (RIE) process, which is a pre-process) are removed by F*. Next, O* acts on the SiGe layers, such that the exposed surfaces of the SiGe layers are oxidized and an oxide film Ox ($SiO_2$ film) is formed. In the oxidation of the SiGe layer, $O_2$ is instead of Ge bonded to Si, which converts the Ge to a gas (for example, $Ge_2F_4$ or $GeOF_2$) to be scattered such that the Ge is transported to the exhaust part 50 by, for example, F* or Ar*, and recovered. In the present embodiment, such a series of removal of deposits and oxidation of SiGe layers are collectively referred to as "modification."

Here, the present inventors examined the oxide film ($SiO_2$ film) formed as described above and found that the oxide film has a small leakage current, ensures good insulation, and has good CV and IV characteristics as an insulating film. That is, it was found that the oxide film may be used as an insulating oxide film. In addition, it was found that a decrease in equivalent oxide thickness (EOT) was slight and heat resistance was also ensured. That is, by using the oxide film thus formed as an inner spacer, it is possible to reduce the number of steps to about ⅓ of that in the existing GAA transistor manufacturing process illustrated in FIGS. 1A to 1D. Specifically, as illustrated in FIGS. 1A to 1D, since the SiGe layers are selectively oxidized only by allowing a processing gas which has been converted into plasma to act on the SiGe layers without performing selective etching of the SiGe layers, and embedding and etching of inner spacers, it is possible to use the formed oxide films as inner spacers. Therefore, it is possible to significantly reduce the number of steps.

When the time for supplying radicals to the processing space S becomes long in one plasma process, the action of radicals on the Si layers may increase. The processing time per set in which the plasma processing is performed is preferably, for example, 30 sec to 180 sec to suppress the influence on the Si layers.

Here, the etching amount of the SiGe layers in the plasma processing, that is, the radial dimension of the SiGe layers is controlled by the plasma processing time as shown in FIG. 5. Therefore, when forming an oxide film at a desired depth while suppressing the action of radicals on the Si layers, it is desirable to repeatedly perform the plasma processing of one set (30 sec to 180 sec) for a plurality of sets.

In addition, when the output in plasma processing becomes high, radicals may also affect the Si layers. The output of the plasma processing is preferably 100 W to 1,000 W as described above to suppress the influence on the Si layers.

In the present embodiment, so-called remote plasma generation in which plasma is generated in a plasma generation space P different from the processing space S in which plasma processing is performed, and the plasma generated in the plasma generation space P is transported to the processing space S. Since ions such as fluorine ions are easily deactivated during transportation, radical-based processing may be performed in the processing space S by using the remote plasma in this way. By using radicals in this way, it is possible to reduce damage to the Si layers, the SiGe layers, and the wafer W.

Then, the wafer W on which the plasma processing in the plasma processing apparatus 1 has been completed is carried out from the plasma processing apparatus 1 by a wafer transport mechanism (not illustrated) provided outside the plasma processing apparatus 1, and a series of plasma processing steps is completed.

As described above, according to the present embodiment, when forming the inner spacer for the SiGe layer, it is possible to modify the SiGe layer only by supplying the processing gas which has been converted into plasma under a desired condition in the plasma processing apparatus 1, and therefore it is possible to reduce the number of steps required for plasma processing. In addition, by reducing the number of steps in this way, it is possible to reduce a cost required for plasma processing and to improve machining accuracy required for forming the inner spacer.

Figure 6A:
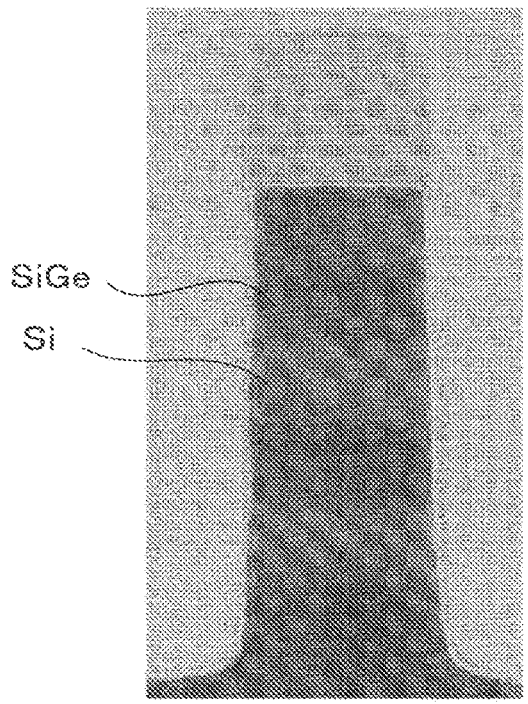
FIGS. 6A and 6B are images showing examples of results of a plasma processing according to an embodiment of the present disclosure.
Figure 6B:
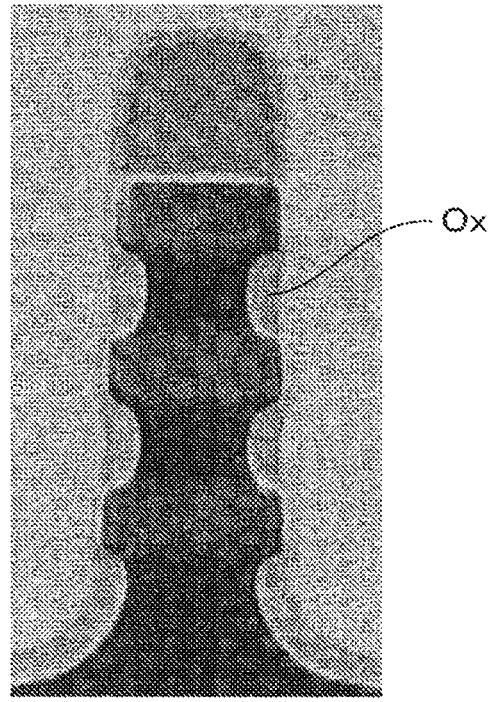

FIGS. 6A and 6B are SEM images showing results of modifying SiGe layers in the plasma processing according to the present embodiment. By the plasma processing according to the present embodiment, as shown in FIG. 6A, among Si layers and SiGe layers formed on a wafer W, only the SiGe layers are appropriately modified, and, as shown in FIG. 6B, it may be seen that an oxide film Ox may be formed.

According to the present embodiment, since F* is supplied to the processing space S to remove deposits, it is not necessary to perform a pre-process (e.g., removal of a natural oxide film by HF processing or the like) prior to plasma processing of the SiGe layers as in the related art.

According to the present embodiment, since remote plasma processing is performed in the plasma processing apparatus, it is possible to suppress the generated plasma from reaching the Si layers, the SiGe layers, and the wafer W, and to suppress damage to the Si layers, the SiGe layers, and the wafer W. Specifically, since the generated radicals containing fluorine and oxygen reach the exposed surface of the wafer W in a deactivated state, it is possible to suppress an influence on the Si layers and the wafer W while appropriately modifying the SiGe layers.

Furthermore, according to the present embodiment, since remote plasma processing is performed at an output of 100 W to 1,000 W and the partition plate 11 of the processing container 10 has the labyrinth structure, it is possible to appropriately suppress the generated ions from reaching the Si layers, the SiGe layers, and the wafer W. That is, it is possible to more appropriately suppress the influence on the Si layers and the wafer W.

In the plasma processing according to the present embodiment, $O_2$, $NF_3$, and Ar are supplied as a processing gas, but Ar gas may be further supplied as an additive gas.

According to the present embodiment, $NF_3$ is selected as the fluorine-containing gas included in the processing gas, but, for example, $SF_6$ gas or $F_2$ gas may be selected as long as F* can be appropriately generated in plasma generation. The dilution gas is not limited to Ar gas, and any gas including at least one of $H_2$ gas and a rare gas may be selected.

The plasma source in the plasma generation space P is not limited to the inductively-coupled plasma as in the present embodiment, and may have an arbitrary configuration, for example, microwave plasma. However, the present inventors conducted the same experiment with a parallel plate type plasma processing apparatus, and it was not possible to appropriately perform a selective modification of SiGe layers as shown in the present embodiment, and Si layers were also modified at the same time. Therefore, in the plasma processing apparatus, it is preferable to generate plasma by remote plasma generation.

After the oxide film is formed by the plasma processing in the present embodiment, removal of an oxide (BT processing) may be performed in a BT processing apparatus (not illustrated).

A wet etching process may be performed on a wafer W in which an oxide film Ox as the inner spacer has been formed as described above, by, for example, an etching apparatus (not illustrated) provided outside the plasma processing apparatus 1. Therefore, in the plasma processing apparatus 1 according to the present embodiment, plasma processing for improving the wet etching resistance of the inner spacer (the oxide film Ox) formed in the above-described embodiment may be further performed.

Specifically, for example, by additionally performing plasma processing on the wafer W on which the oxide film Ox is formed by using a second processing gas including a nitrogen-containing gas (e.g., $N_2$ gas, $NH_3$ gas, $NF_3$ gas, or the like), it is possible to improve the wet etching resistance of the inner spacer (the oxide film Ox).

Figure 8:
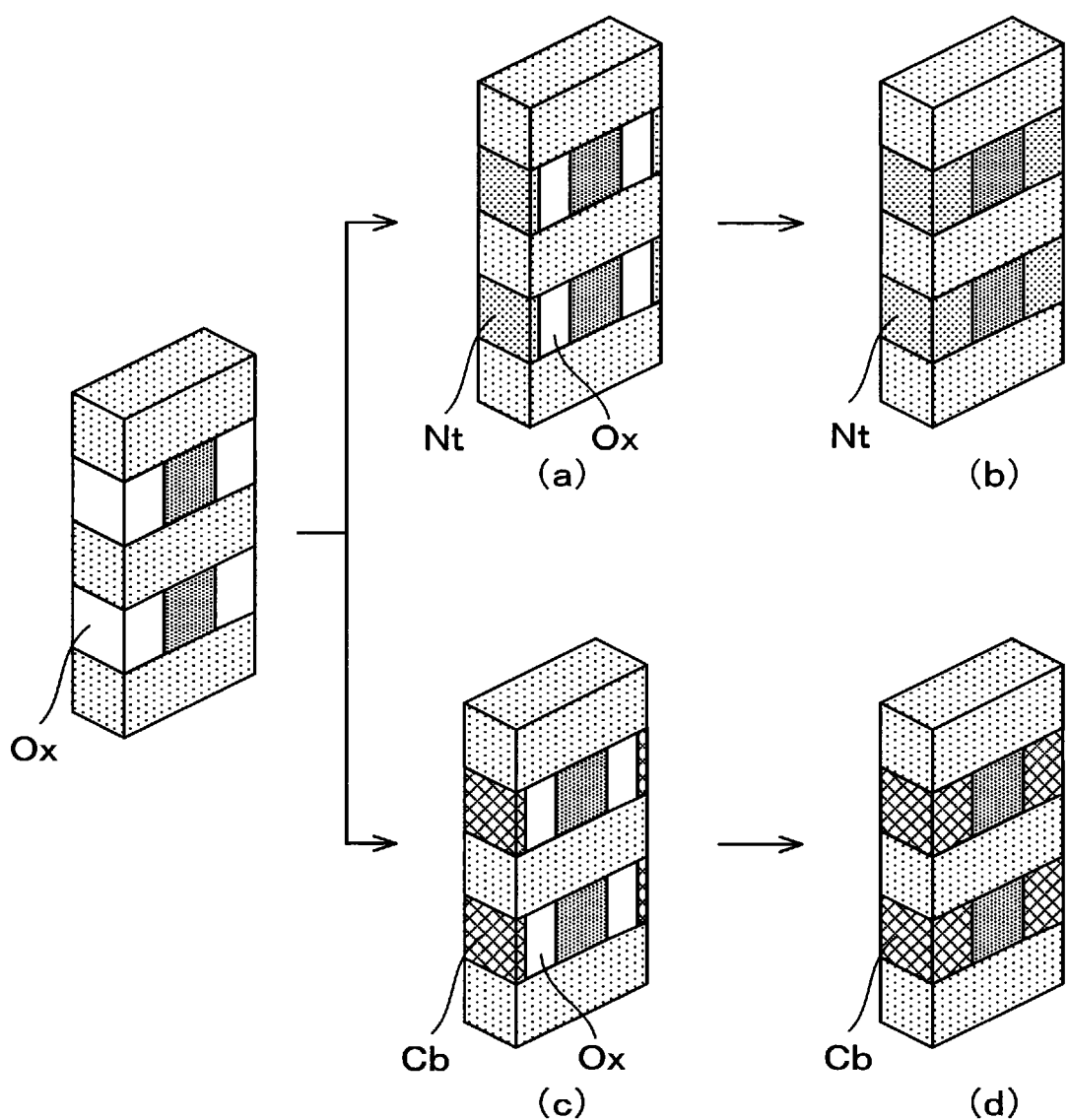
FIG. 8 is an explanatory view illustrating states of modifying oxide film.

When the plasma processing is performed on the wafer W by using the second processing gas, N* acts on the oxide film Ox, the oxide film Ox is nitrided, and as illustrated in (a) of FIG. 8, a nitride film Nt as a protective film is formed on the surface layer of the inner spacer. In the nitriding of a $SiO_2$ film as the oxide film Ox, N instead of $O_2$ is bonded to Si, which converts $O_2$ into a gas to be scattered. By forming a nitride film Nt (for example, SiN film) having wet etching resistance on at least the surface layer of the inner spacer in this way, the oxide film Ox is protected from an etching solution by the nitride film Nt during the wet etching process. That is, while the characteristics as the inner spacer are maintained by the oxide film Ox remaining inside the nitride film Nt, it is possible to improve the wet etching resistance by the nitride film Nt.

The present inventors examined the nitride film Nt formed as described above and found that, even with such a nitride film, at least the characteristics as the inner spacer can exhibited. That is, in the illustration of (a) in FIG. 8, at least the surface layer of the oxide film Ox was nitrided to form the oxide film Ox and the nitride film Nt in a laminated manner, but, for example, as illustrated in (b) of FIG. 8, the entire oxide film Ox may be replaced with the nitride film Nt, and the nitride film Nt may be used as the inner spacer. However, since the oxide film Ox has better insulating film characteristics (CV and IV characteristics) than the nitride film Nt, it is more preferable to make the nitride film Nt act as a protective film for the oxide film Ox as the inner spacer, as also illustrated in (a) of FIG. 8.

The film formed by plasma processing for improving wet etching resistance is not limited to the above-described nitride film Nt. For example, a second processing gas including a carbon-containing gas is used to carbonize the oxide film Ox, and, as illustrated in (c) of FIG. 8, a carbide film Cb (e.g., a SiC film) having wet etching resistance may be formed on at least the surface layer of the inner spacer. As the carbon-containing gas, for example, $CH_4$ gas, $CHF_3$ gas, $CH_2F_2$ gas, $CH_3F$ gas, $CF_4$ gas, $C_4F_6$ gas, $C_4F_8$ gas, CO gas, $CO_2$ gas, COS gas, or the like may be used. Even when the carbide film Cb is formed in this way, it is possible to improve the resistance to the wet etching processing performed in the subsequent processing step, like the nitride film Nt.

The present inventors examined the carbide film Cb formed in this way and found that such a carbide film Cb has better characteristics as an insulating film (CV and IV characteristics) than the oxide film Ox such that a dielectric constant of the inner spacer can be further reduced. That is, as illustrated in (c) of FIG. 8, at least the surface layer of the oxide film Ox is carbonized to form the oxide film Ox and the carbide film Cb to be laminated, but, for example, as illustrated in (d) of FIG. 8, the entire oxide film Ox may be replaced with the carbon film Cb, and the carbide film Cb may be used as the inner spacer. In such a case, as compared with the case in which the oxide film Ox is used as the inner space, it is possible to improve wet etching resistance and to further improve an insulating property of the inner spacer.

Figure 7:
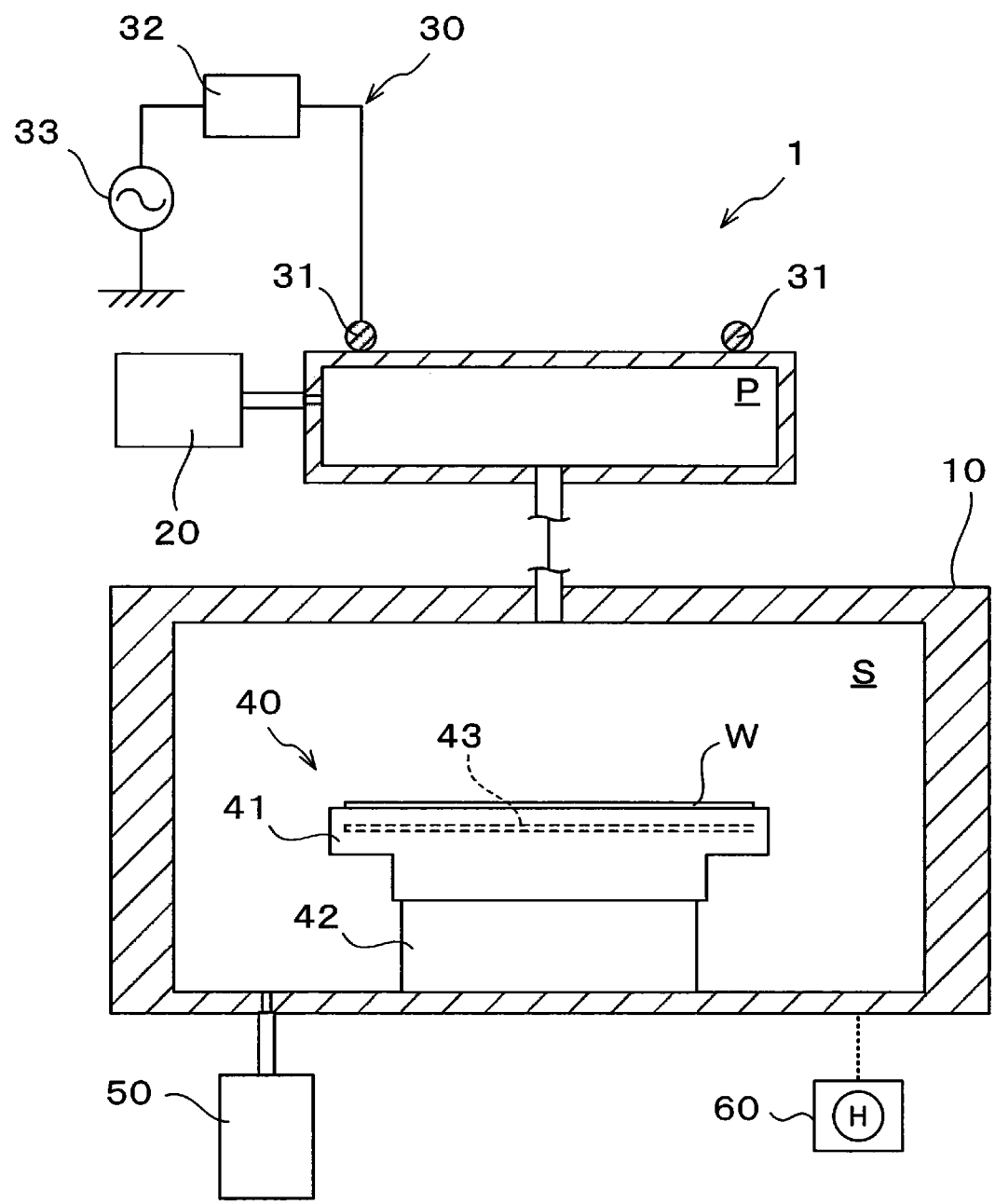
FIG. 7 is a vertical cross-sectional view showing an example of another configuration of a plasma processing apparatus.

In the present embodiment, in the plasma processing apparatus 1, the plasma generation space P is integrally provided in the same chamber as the processing space S, that is, in the upper portion of the processing container 10, but the configuration of the plasma processing apparatus 1 is not limited to thereto. For example, as illustrated in FIG. 7, the plasma generation space P may be provided outside the processing container 10.

The embodiments disclosed herein should be considered to be exemplary in all respects and not restrictive. The above-described embodiments may be omitted, replaced or modified in various forms without departing from the scope and gist of the appended claims.

The following configurations also fall within the technical scope of the present disclosure.

(1) A substrate processing method of processing a substrate on which a silicon layer and a silicon germanium layer are alternately laminated, the substrate processing method including:

forming an oxide film by selectively modifying a surface layer of an exposed surface of the silicon germanium layer by using a processing gas including fluorine and oxygen and converted into plasma.

According to (1), it is possible to generate plasma with a processing gas including fluorine and oxygen in the plasma processing of the substrate on which the silicon layer and the silicon germanium layer are alternately laminated, and to appropriately perform modification of the silicon germanium layer (removal of deposits and oxidation of the silicon germanium layer) only by supplying such a processing gas converted into plasma.

(2) The substrate processing method of (1), wherein the processing gas includes an $O_2$ gas and a fluorine-containing gas, and the volume ratio of the fluorine-containing gas to the $O_2$ gas is 0.1 vol % or more and 1.0 vol % or less.

(3) The substrate processing method of (2), wherein the fluorine-containing gas is a $NF_3$ gas, a $F_2$ gas, or a $SF_6$ gas.

(4) The substrate processing method any one of (1) to (3), wherein the processing gas further includes at least one of a $H_2$ gas and a rare gas.

(5) The substrate processing method of any one of (1) to (4), wherein remote plasma is used when the processing gas is converted into plasma.

According to (5), by generating the processing gas by remote plasma, it is possible to appropriately suppress damage to the Si layer, the SiGe layer and the wafer W and to appropriately modify the SiGe layer.

(6) The substrate processing method any one of (1) to (5), wherein an etching amount of the silicon germanium layer from the exposed surface is proportional to a plasma processing time for the substrate.

(7) The substrate processing method any one of (1) to (6), wherein a thickness of the oxide film thus formed is saturated at a desired value regardless of a plasma processing time for the substrate.

(8) The substrate processing method of (6) or (7), wherein a plasma processing for the substrate is repeatedly performed, and a plasma processing time for one set is 30 sec to 180 sec.

According to (8), it is possible to more appropriately suppress damage to the Si layer by controlling the plasma processing time to a required time. In addition, by repeating the plasma processing, it is possible to appropriately modify the surface layer of the exposed surface of the SiGe layer, that is, to perform the modification from the exposed surface to a desired depth.

(9) A substrate processing method according to any one of (1) to (8), including forming a nitride film by modifying at least the surface layer of the oxide film by using a second processing gas including a nitrogen-containing gas and converted into plasma.

(10) The substrate processing method of any one of (1) to (8), including forming a carbide film by modifying at least the surface layer of the oxide film by using a second processing gas including a carbon-containing gas and converted into plasma.

According to (9) or (10), by forming the nitride film or the carbide film by further modifying at least the surface layer of the oxide film formed on the surface layer of the exposed surface, it is possible to improve resistance to a wet etching process performed in a processing step, for example, after forming the inner spacer.

(11) A substrate processing apparatus which processes a substrate in which a silicon layer and a silicon germanium layer are alternatively laminated, the substrate processing apparatus including:

a processor configured to form an oxide film by selectively modifying a surface layer of an exposed surface of the silicon germanium layer by using a processing gas including fluorine and oxygen and converted into plasma; and a controller configured to control plasma processing in the processor.

(12) The substrate processing apparatus of (11), wherein the processing gas includes an $O_2$ gas and a fluorine-containing gas, and wherein the controller is configured to control a supply amount of the processing gas in the processor such that the volume ratio of the fluorine-containing gas to the $O_2$ gas is 0.1 vol % or more and 1.0 vol % or less.

(13) The substrate processing apparatus of (12), wherein the fluorine-containing gas is a $NF_3$ gas, a $F_2$ gas, or a $SF_6$ gas.

(14) The substrate processing apparatus of any one of (11) to (13), wherein the controller is configured to control the supply of the processing gas in the processor to further supply at least one of a $H_2$ gas and a rare gas.

(15) The substrate processing apparatus of any one of (11) to (14), wherein remote plasma is used when the processing gas is converted into plasma in the processor.

(16) The substrate processing apparatus of any one of (11) to (15), wherein an etching amount of the silicon germanium layer from the exposed surface in the plasma processing is proportional to a plasma processing time.

(17) The substrate processing apparatus of any one of (11) to (16), wherein a thickness of the oxide film thus formed in the plasma processing is saturated at a desired value regardless of a plasma processing time.

(18) The substrate processing apparatus of (16) or (17), wherein the controller is configured to repeatedly perform the plasma processing on the substrate and control a plasma processing time for one set from 30 sec to 180 sec.

(19) The substrate processing apparatus of any one of (11) to (18), wherein the controller is configured to control the plasma processing in the processor to form a nitride film by modifying at least the surface layer of the oxide film by using a second processing gas including a nitrogen-containing gas.

(20) The substrate processing apparatus of any one of (11) to (18), wherein the controller is configured to control the plasma processing in the processor to form a carbide film by modifying at least the surface layer of the oxide film by using a second processing gas including a carbon-containing gas and converted into plasma.

(21) A method of manufacturing a nanowire or nanosheet transistor by using a substrate in which a silicon layer and a silicon germanium layer are alternately laminated, the method including:
  forming an insulating oxide film by selectively modifying a surface layer of an exposed surface of the silicon germanium layer by using a processing gas including fluorine and oxygen and converted into plasma.

(22) The method of (21), including forming an insulating nitride film by modifying at least the surface layer of the insulating oxide film by using a second processing gas including a nitrogen-containing gas and converted into plasma.

(23) The method of (21), including forming a carbide film by modifying at least the surface layer of the oxide film by using a second processing gas including a carbon-containing gas and converted into plasma.

EXPLANATION OF REFERENCE NUMERALS

1: plasma processing apparatus, 60: controller, S: processing space, W: wafer

What is claimed is:

1. A substrate processing method of processing a substrate in which a silicon layer and a silicon germanium layer are alternatively laminated, the substrate processing method comprising:
  forming an oxide film by selectively modifying a surface layer of an exposed surface of the silicon germanium layer by using a processing gas including fluorine and oxygen and converted into plasma; and
  forming a nitride film by modifying at least the surface layer of the oxide film by using a second processing gas including a nitrogen-containing gas and converted into plasma.

2. The substrate processing method of claim 1, wherein the processing gas includes an $O_2$ gas and a fluorine-containing gas, and a volume ratio of the fluorine-containing gas to the $O_2$ gas is 0.1 vol % or more and 1.0 vol % or less.

3. The substrate processing method of claim 2, wherein the fluorine-containing gas is a $NF_3$ gas, a $F_2$ gas, or a $SF_6$ gas.

4. The substrate processing method of claim 1, wherein the processing gas further includes at least one of a $H_2$ gas and a rare gas.

5. The substrate processing method of claim 1, wherein remote plasma is used when the processing gas is converted into plasma.

6. The substrate processing method of claim 1, wherein an etching amount of the silicon germanium layer from the exposed surface is proportional to a plasma processing time for the substrate.

7. The substrate processing method of claim 1, wherein a thickness of the oxide film thus formed is saturated at a set value regardless of a plasma processing time for the substrate.

8. The substrate processing method of claim 6, wherein a plasma processing for the substrate is repeatedly performed, and a plasma processing time for one set is 30 sec to 180 sec.

9. The substrate processing method of claim 1, further comprising forming a carbide film by modifying at least the surface layer of the oxide film by using a second processing gas including a carbon-containing gas and converted into plasma.

10. A substrate processing apparatus which processes a substrate in which a silicon layer and a silicon germanium layer are alternatively laminated, the substrate processing apparatus comprising:
  a processor configured to form an oxide film by selectively modifying a surface layer of an exposed surface of the silicon germanium layer by using a processing gas including fluorine and oxygen and converted into plasma; and
  a controller configured to control plasma processing in the processor,
  wherein the controller is further configured to control the plasma processing in the processor to form a nitride film by modifying at least the surface layer of the oxide film by using a second processing gas including a nitrogen-containing gas and converted into plasma.

11. The substrate processing apparatus of claim 10, wherein the processing gas includes an $O_2$ gas and a fluorine-containing gas, and
  wherein the controller is further configured to control a supply amount of the processing gas in the processor such that a volume ratio of the fluorine-containing gas to the $O_2$ gas is 0.1 vol % or more and 1.0 vol % or less.

12. The substrate processing apparatus of claim 11, wherein the fluorine-containing gas is a $NF_3$ gas, a $F_2$ gas, or a $SF_6$ gas.

13. The substrate processing apparatus of claim 10, wherein the controller is further configured to control supply of the processing gas in the processor to further supply at least one of a $H_2$ gas and a rare gas.

14. The substrate processing apparatus of claim 10, wherein remote plasma is used when the processing gas is converted into plasma in the processor.

15. The substrate processing apparatus of claim 10, wherein an etching amount of the silicon germanium layer from the exposed surface in the plasma processing is proportional to a plasma processing time.

16. The substrate processing apparatus of claim 10, wherein a thickness of the oxide film thus formed in the plasma processing is saturated at a desired set value regardless of a plasma processing time.

17. The substrate processing apparatus of claim 15, wherein the controller is further configured to repeatedly perform the plasma processing on the substrate and control a plasma processing time for one set from 30 sec to 180 sec.

18. The substrate processing apparatus of claim 10, wherein the controller is further configured to control the plasma processing in the processor to form a carbide film by modifying at least the surface layer of the oxide film by using a second processing gas including a carbon-containing gas and converted into plasma.

19. A method of manufacturing a nanowire or nanosheet transistor by using a substrate in which a silicon layer and a silicon germanium layer are alternatively laminated, the method comprising:

forming an insulating oxide film by selectively modifying a surface layer of an exposed surface of the silicon germanium layer by using a processing gas including fluorine and oxygen and converted into plasma; and forming a nitride film by modifying at least the surface layer of the insulating oxide film by using a second processing gas including a nitrogen-containing gas and converted into plasma.

20. The method of claim 19, further comprising forming a carbide film by modifying at least the surface layer of the insulating oxide film by using a second processing gas including a carbon-containing gas and converted into plasma.

* * * * *